(12) United States Patent
Bui et al.

(10) Patent No.: US 8,324,670 B2
(45) Date of Patent: Dec. 4, 2012

(54) EDGE ILLUMINATED PHOTODIODES

(75) Inventors: Peter Steven Bui, Westminster, CA (US); Narayan Dass Taneja, Long Beach, CA (US); Manoocher Mansouri, Studio City, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 189 days.

(21) Appl. No.: 12/760,342

(22) Filed: Apr. 14, 2010

(65) Prior Publication Data

US 2010/0289105 A1 Nov. 18, 2010

Related U.S. Application Data

(63) Continuation of application No. 11/849,623, filed on Sep. 4, 2007, now Pat. No. 7,728,367, which is a continuation of application No. 11/383,485, filed on May 15, 2006, now Pat. No. 7,279,731.

(51) Int. Cl.
*H01L 31/062* (2012.01)
*H01L 31/113* (2006.01)
*H01L 31/0232* (2006.01)
*H01L 31/06* (2012.01)

(52) U.S. Cl. ........................................ 257/292

(58) Field of Classification Search .............. 257/78–82, 257/290–294, 431–448, 460–465, E29.336
See application file for complete search history.

(56) References Cited

U.S. PATENT DOCUMENTS

| | | |
|---|---|---|
| 3,041,226 A | 6/1962 | Pennington |
| 3,713,921 A | 1/1973 | Fleischer et al. |
| 3,765,969 A | 10/1973 | Kragness et al. |
| 3,801,390 A | 4/1974 | Lepselter et al. |
| 3,808,068 A | 4/1974 | Johnson et al. |
| 4,210,923 A | 7/1980 | North et al. |
| 4,290,844 A | 9/1981 | Rotolante et al. |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,049,962 A | 9/1991 | Huang et al. |
| 5,053,318 A | 10/1991 | Gulla et al. |
| 5,144,379 A | 9/1992 | Eshita et al. |
| 5,214,276 A | 5/1993 | Himoto et al. |

(Continued)

FOREIGN PATENT DOCUMENTS

EP 0 347 157 12/1989

(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, 1995.

(Continued)

*Primary Examiner* — Cuong Q Nguyen
(74) *Attorney, Agent, or Firm* — Novel IP

(57) ABSTRACT

This invention comprises plurality of edge illuminated photodiodes. More specifically, the photodiodes of the present invention comprise novel structures designed to minimize reductions in responsivity due to edge surface recombination and improve quantum efficiency. The novel structures include, but are not limited to, angled facets, textured surface regions, and appropriately doped edge regions.

19 Claims, 11 Drawing Sheets

U.S. PATENT DOCUMENTS

| | | | |
|---|---|---|---|
| 5,237,197 A | 8/1993 | Snoeys et al. |
| 5,252,142 A | 10/1993 | Matsuyama et al. |
| 5,254,480 A | 10/1993 | Tran |
| 5,276,955 A | 1/1994 | Noddin et al. |
| 5,408,122 A | 4/1995 | Reele |
| 5,430,321 A | 7/1995 | Effelsberg |
| 5,446,751 A | 8/1995 | Wake |
| 5,501,990 A | 3/1996 | Holm et al. |
| 5,576,559 A | 11/1996 | Davis |
| 5,599,389 A | 2/1997 | Iwasaki |
| 5,656,508 A | 8/1997 | So et al. |
| 5,818,096 A | 10/1998 | Ishibashi et al. |
| 5,825,047 A | 10/1998 | Ajisawa et al. |
| 5,869,834 A | 2/1999 | Wipenmyr |
| 5,889,313 A | 3/1999 | Parker |
| 5,923,720 A | 7/1999 | Barton et al. |
| 5,928,438 A | 7/1999 | Salami et al. |
| 6,027,956 A | 2/2000 | Irissou |
| 6,175,141 B1 | 1/2001 | Hofbauer et al. |
| 6,218,684 B1 | 4/2001 | Kuhara et al. |
| 6,326,300 B1 | 12/2001 | Liu et al. |
| 6,326,649 B1 | 12/2001 | Chang et al. |
| 6,352,517 B1 | 3/2002 | Flock et al. |
| 6,426,991 B1 | 7/2002 | Mattson et al. |
| 6,438,296 B1 | 8/2002 | Kongable |
| 6,489,635 B1 | 12/2002 | Sugg |
| 6,504,158 B2 | 1/2003 | Possin |
| 6,510,195 B1 | 1/2003 | Chappo et al. |
| 6,546,171 B2 | 4/2003 | Fukutomi |
| 6,569,700 B2 | 5/2003 | Yang |
| 6,593,636 B1 | 7/2003 | Bui et al. |
| 6,670,258 B2 | 12/2003 | Carlson et al. |
| 6,734,416 B2 | 5/2004 | Carlson et al. |
| 6,772,729 B2 | 8/2004 | Brosseau et al. |
| 6,815,790 B2 | 11/2004 | Bui et al. |
| 6,826,080 B2 | 11/2004 | Park et al. |
| 7,057,254 B2 | 6/2006 | Bui et al. |
| 7,112,465 B2 | 9/2006 | Goushcha et al. |
| 7,242,069 B2 | 7/2007 | Bui et al. |
| 7,256,470 B2 | 8/2007 | Bui et al. |
| 7,279,731 B1 * | 10/2007 | Bui et al. | 257/292 |
| 7,622,785 B2 * | 11/2009 | Sasagawa et al. | 257/432 |
| 7,649,236 B2 * | 1/2010 | Fujii et al. | 257/458 |
| 2001/0034105 A1 | 10/2001 | Carlson |
| 2002/0056845 A1 | 5/2002 | Iguchi et al. |
| 2004/0104351 A1 | 6/2004 | Shibayama |
| 2004/0206886 A1 | 10/2004 | Carlson et al. |
| 2004/0222358 A1 | 11/2004 | Bui et al. |
| 2004/0222482 A1 | 11/2004 | Bui et al. |
| 2004/0241897 A1 | 12/2004 | Rhee et al. |
| 2004/0262652 A1 | 12/2004 | Goushcha et al. |
| 2006/0220078 A1 | 10/2006 | Bui et al. |
| 2006/0255420 A1 | 11/2006 | Bui et al. |
| 2006/0278898 A1 | 12/2006 | Shibayama |
| 2007/0090394 A1 | 4/2007 | Bui et al. |
| 2007/0257329 A1 | 11/2007 | Bui et al. |
| 2007/0278534 A1 | 12/2007 | Bui et al. |
| 2007/0296005 A1 | 12/2007 | Bui et al. |
| 2008/0067622 A1 | 3/2008 | Bui et al. |
| 2008/0128846 A1 | 6/2008 | Bui et al. |
| 2008/0277753 A1 | 11/2008 | Bui et al. |

FOREIGN PATENT DOCUMENTS

| | | |
|---|---|---|
| EP | 0436282 | 7/1991 |
| EP | 0 723 301 A2 | 5/1997 |
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

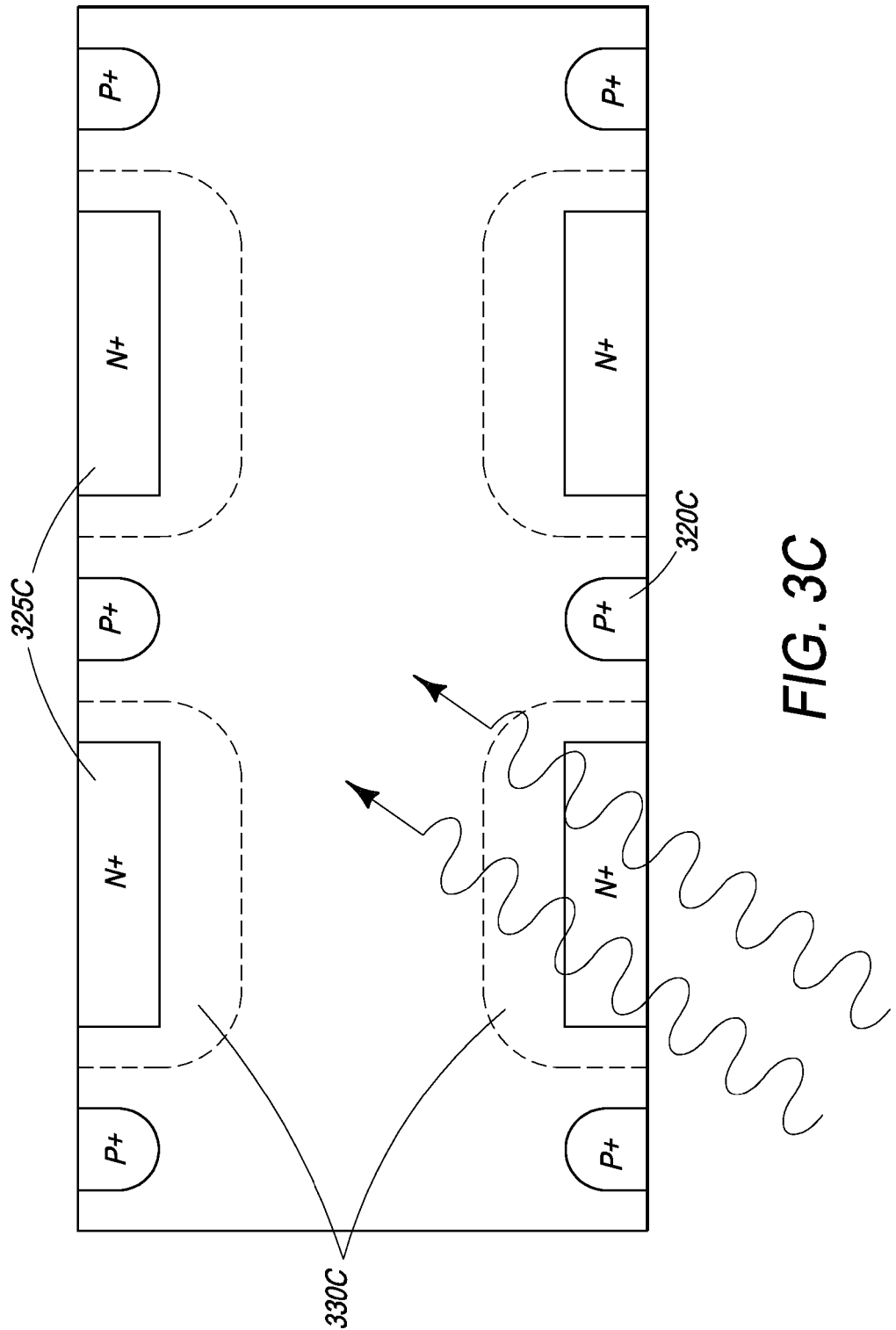

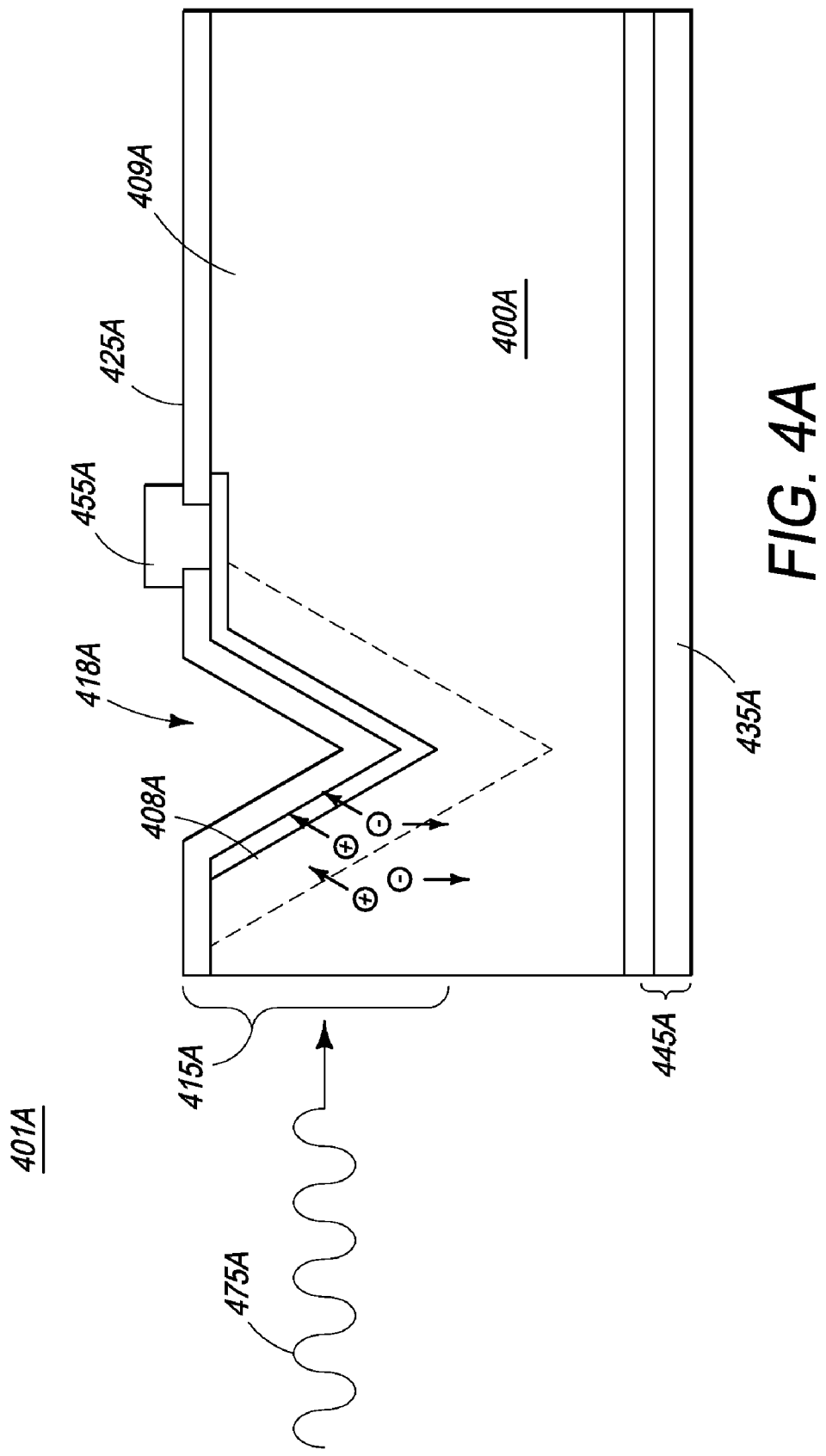

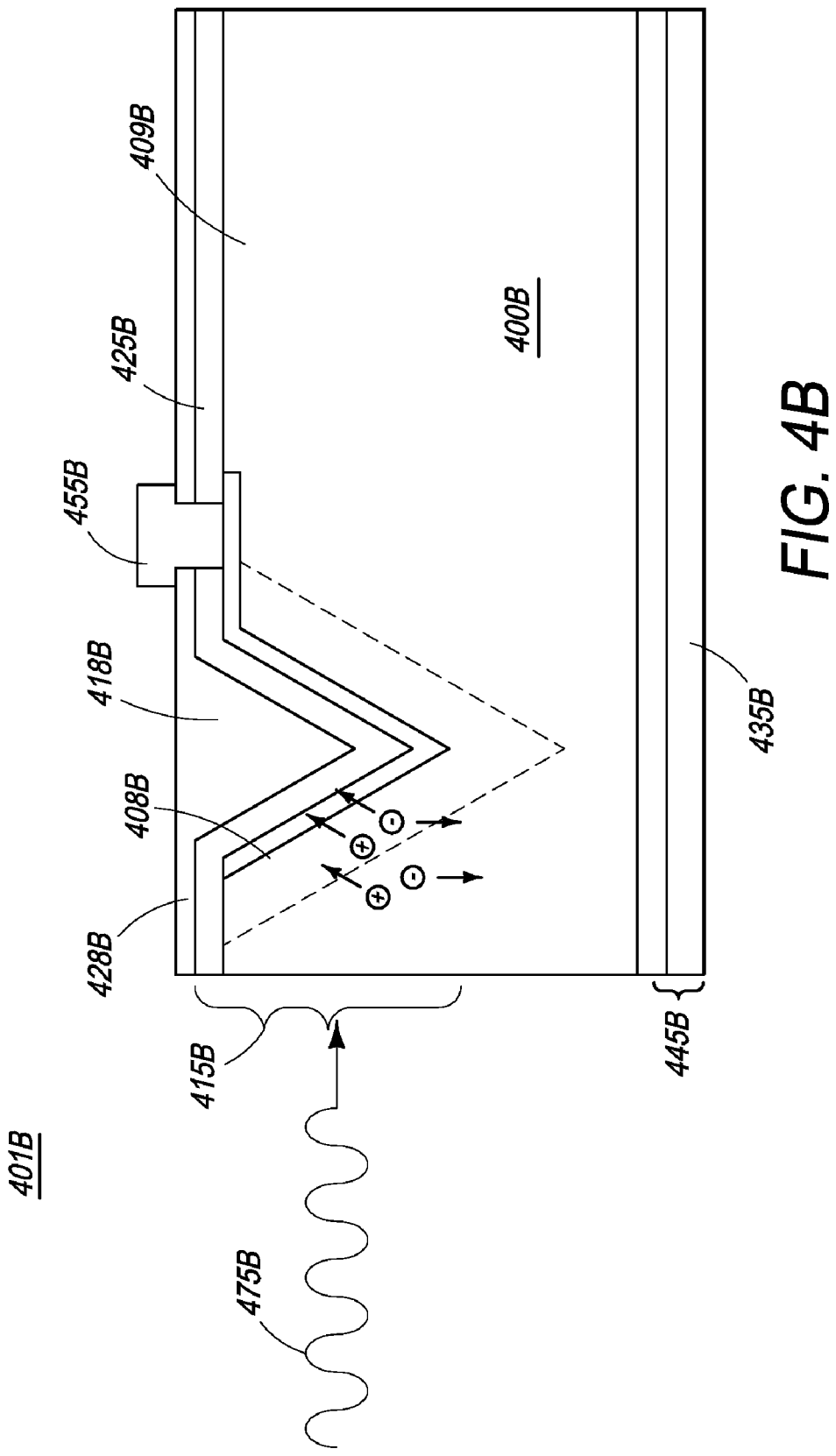

EDGE ILLUMINATED PHOTODIODES

CROSS-REFERENCE

The present application is a continuation of U.S. patent application Ser. No. 11/849,623, filed on Sep. 4, 2007 and issued as U.S. Pat. No. 7,728,367, which is a continuation of U.S. patent application Ser. No. 11/383,485, filed on May 15, 2006 and issued as U.S. Pat. No. 7,279,731.

FIELD OF THE INVENTION

The present invention is directed toward photodiodes having improved operational and structural characteristics. More specifically, the present invention is directed towards novel edge illuminated photodiodes, and applications using the same, possessing high responsivity, enhanced quantum efficiency using n+ diffused region, and p+ textured region on silicon, and InGaAs/InP substrates respectively.

BACKGROUND OF THE INVENTION

Photodiodes comprise a plurality of electrode radiation-sensitive junctions formed in semiconductor material. Within a photodiode, charge carriers are created by light that illuminates the junction and photo current is generated dependent upon the degree of illumination. Photodiodes are used for detection of optical power and subsequent conversion of the same to electrical power. Operationally, photodiodes absorb photons and charged particles, which facilitate detection of incident optical power, thereby generating current proportional to the incident power.

Photodiodes are typified by the quantification of certain characteristics, such as electrical, optical, current (I), voltage (V), and noise. Electrical characteristics predominantly include shunt resistance, series resistance, junction capacitance, rise or fall time and frequency response whereas optical characteristics include responsivity, quantum efficiency, non-uniformity, and non-linearity. Noise in photodiodes is generated by a plurality of sources including, but not limited to, thermal noise, quantum or photon or shot noise, and flicker noise.

In the semiconductor industry it is often desirable to increase light-induced current of photodiodes in order to increase the signal-to-noise ratio and thereby enhance photodiode sensitivity. Photodiode sensitivity is crucial in low light-level applications and is typically quantified by noise equivalent power (NEP) defined as the optical power that produces a signal-to-noise ratio of unity at the detector output. NEP is usually specified at a given wavelength and over a frequency bandwidth of 1 Hz and is therefore expressed in units of $W/Hz^{1/2}$.

Silicon photodiodes, essentially active solid-state semiconductor devices, are among the most popular photodetectors providing high performance over a wide wavelength range. For example, silicon photodiodes are sensitive to light in the wide spectral range, approximately $200*10^{-9}$ m to $1200*10^{-9}$ m, extending from deep ultraviolet all the way through visible to near infrared. Additionally, silicon photodiodes detect the presence or absence of minute light intensities thereby facilitating precise measurement of the same on appropriate calibration. For instance, appropriately calibrated silicon photodiodes detect and measure light intensities varying over a wide range, from very minute light intensities of below $10^{-13}$ watts/$cm^2$ to high intensities above $10^{-3}$ watts/$cm^2$.

Silicon photodiodes can be employed in an assortment of applications including, but not limited to, spectroscopy, distance and speed measurement, laser ranging, laser guided missiles, laser alignment and control systems, optical free air communication, optical radar, radiation detection, optical position encoding, film processing, flame monitoring, scintillator read out, environmental applications such as spectral monitoring of earth ozone layer and pollution monitoring, low light-level imaging, such as night photography, nuclear medical imaging, photon medical imaging, and multi-slice computer tomography (CT) imaging, security screening and threat detection, thin photochip applications, and a wide range of computing applications.

Several problems exist with conventional photodiodes currently in use. In particular, for relatively short wavelength illumination, for instance below 800 nm, edge-illuminated silicon photodiodes absorb light very strongly near the edge surfaces thereby leading to low responsivity due to edge surface recombination. Likewise, controlling quantum efficiency, specifically in case of edge illuminated InGaAs/InP photodiodes, still remains a challenge.

The prior art fails to describe edge illuminated photodiodes that provide for lesser susceptibility to surface recombination effects, and possess high responsivity, and high quantum efficiency respectively. Consequently, there is still a need for photodiodes possessing high responsivity and high quantum efficiency. More specifically, there is demand for high responsivity edge illuminated silicon photodiodes having lesser susceptibility to surface recombination effects, which in turn is accountable for minimization of responsivity. Furthermore, high quantum efficiency edge illuminated InGaAs/InP photodiodes are also still needed.

SUMMARY OF THE INVENTION

The present invention is directed toward photodiodes having improved operational and structural characteristics. In one embodiment, the present invention is a photodiode comprising a substrate with at least a plurality of facets, wherein said plurality of facets comprise a proximate facet substantially comprising a region doped with an impurity of a first conductivity type; a distant facet parallel to the proximate facet; a top facet having an anode metallization region and having a region proximate to said anode metallization region doped with an impurity of a second conductivity type; a bottom facet having a cathode metallization layer; a left facet; and a right facet parallel to the left facet.

In a second embodiment, the present invention is a photodiode comprising a substrate with at least a plurality of facets, wherein said plurality facets comprise a proximate facet; a distant facet, having an inner face and an outer face, parallel to the proximate facet; a top facet having an anode metallization region and a textured region doped with an impurity of a selected conductivity type; a bottom facet, having an inner face and an outer face, parallel to the top facet and further comprising a cathode metallization layer; a left facet; a right facet parallel to the left facet; and an angled facet having an inner face and an outer face, wherein the inner face of said angled facet forms an angle with the inner face of said distant facet of greater than 90 degrees.

In another embodiment, the present invention is a photodiode comprising a substrate with at least a plurality of facets, wherein said plurality facets comprise a proximate facet; a distant facet, having an inner face and an outer face, parallel to the proximate facet; a top facet having a metallization region, a region doped with an impurity of a first conductivity type, and at least two regions doped with an impurity of a second conductivity type wherein said second conductivity type is different from said first conductivity type; a bottom facet, having an inner face and an outer face, parallel to the top facet and further comprising a metallization layer; a left facet; a right facet parallel to the left facet; and an angled facet having an inner face and an outer face, wherein the inner face of said angled facet forms an angle with the inner face of said distant facet of greater than 90 degrees.

In another embodiment, the present invention is a photodiode comprising a substrate having a first conductivity type, a top region, and a bottom region; a metallization layer of the first conductivity type extending the length of the bottom region; a V-groove extending the width of said top region; an oxide layer extending the full length of the top region; a metallization region of a second conductivity type extending above the top region and through said oxide layer; and a layer diffused with said second conductivity type positioned below said oxide layer in the top region and extending the length of said V-groove, wherein said layer is in physical communication with said metallization region of the second conductivity type. Optionally, the photodiode has a layer of film covers the top region and wherein said layer creates a substantially planar surface above the V-groove.

BRIEF DESCRIPTION OF THE DRAWINGS

These and other features and advantages of the present invention will be appreciated, as they become better understood by reference to the following detailed description when considered in connection with the accompanying drawings:

FIG. 2b depicts a flipped perspective view of the edge illuminated photodiode of FIG. 2a;

FIG. 3c is a schematic view depicting PN-junctions and the depletion region of another embodiment of the present invention;

FIG. 4a is a schematic view of another embodiment of the present invention, comprising an interior V-groove;

FIG. 4b is a schematic view of another embodiment of the present invention, comprising an interior V-groove and a layer of film.

DETAILED DESCRIPTION OF THE INVENTION

Figure 1A:
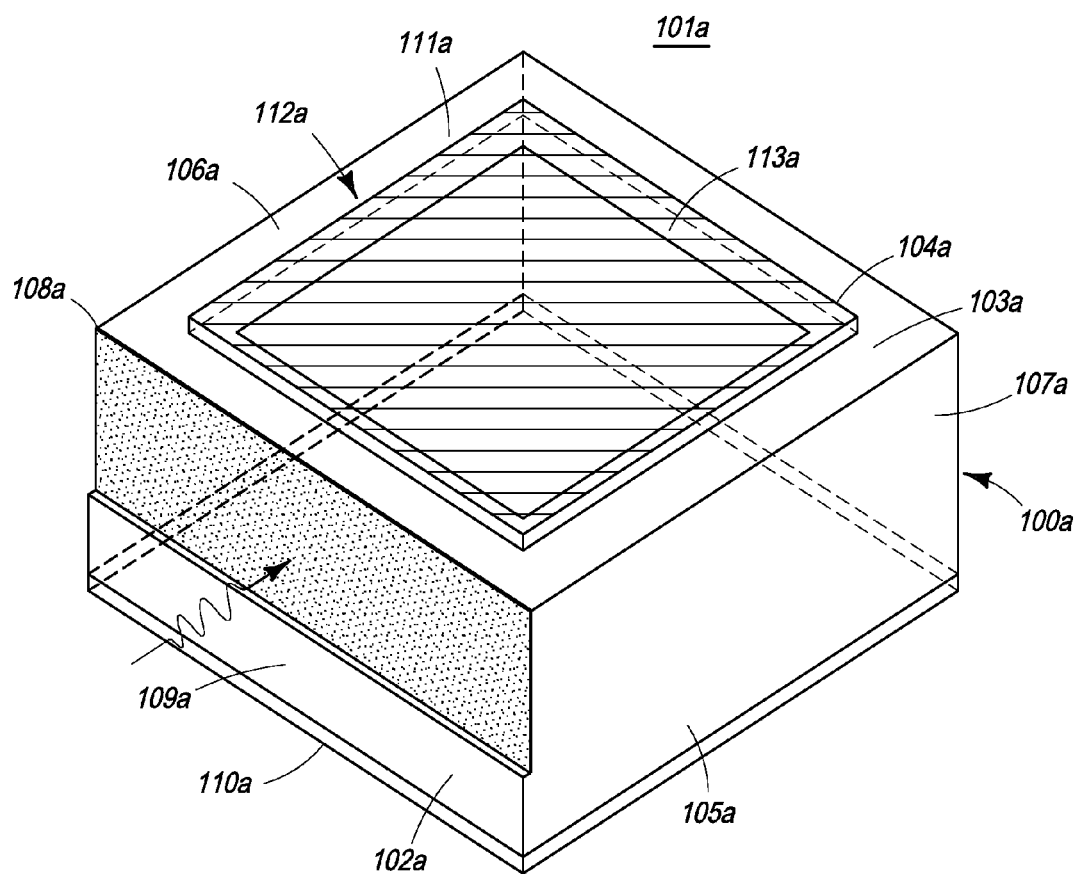
FIG. 1a is a perspective view of one embodiment of an edge illuminated photodiode.

The invention described herein comprises a plurality of photodiodes, optionally constructed as a diode array, each comprising n+ diffused regions, or angled facets and textured p+ regions. These photodiodes have improved performance characteristics, including, but not limited to, improved responsivity and enhanced quantum efficiency.

The photodiodes of the present invention can be constructed using semiconductor materials known to persons of ordinary skill in the art. In one embodiment, edge illuminated photodiodes are formed on photochips of semiconductor materials, including, but not limited to, Indium Gallium Arsenide (InGaAs), Indium Phosphide (InP), or silicon respectively. These photochips may be cuboidal in geometry possessing at least a plurality of sides, also referred to as a face or facet.

In a first embodiment, the edge illuminated photodiode is incorporated in a photochip having six distinct facets, namely proximate, distant, top, bottom, left, and right respectively. The proximate and distant facets are substantially parallel to each other. The top and bottom facets are substantially parallel to each other, and the left and right facets are substantially parallel to each other. The proximate facet substantially comprises an n+ diffused region. The bottom facet comprises a cathode metallization layer. The top facet comprises two regions, namely an anode metallization region and a p+ doped region. The p+ doped region is juxtaposed to the anode metallization region.

In second embodiment, an edge illuminated photodiode is incorporated in a substrate having seven distinct facets. Six facets include a proximate, distant, top, bottom, left, and right facet, respectively. The proximate and distant facets are substantially parallel to each other. The top and bottom facets are substantially parallel to each other, and the left and right facets are substantially parallel to each other. The seventh facet is formed at an angle to no less than two facets, i.e., the distant and bottom facets, respectively. Preferably the angle of formation, measured relative to the internal face of each facet (the sides facing the inside of the photodiode), is greater than 90 degrees. More preferably, the angle of formation is 135 degrees.

In one embodiment, the top facet comprises two regions, namely an anode metallization region and a p+ doped and textured region. The p+ region, juxtaposed to the anode metallization region, is textured to reduce reflectance at this surface, thereby improving quantum efficiency of the photodiode. The p+ region is preferably textured to form a plurality of square base pyramids therein. Alternatively, the top facet comprises three regions: a p+ doped region and two n+ doped regions where the peripheral portion of both the n+ doped regions is delimited by a metallic plate. The bottom facet is comprises a cathode metallization layer.

The present invention is directed towards detector structures for an assortment of applications. More specifically, the present invention is directed towards novel edge illuminated photodiodes, and applications using the same, possessing high responsivity and enhanced quantum efficiency using n+ diffused region and p+ textured region for P on N silicon or p+ diffused region and n+ textured region for N on P silicon and InGaAs/InP substrates. Various modifications to the preferred embodiment will be readily apparent to those of ordinary skill in the art, and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

The present invention comprises several embodiments that provide for lesser susceptibility to surface recombination effects and reflectance and absorption losses and further provides for enhanced responsivity and improved quantum efficiency. In one embodiment, the present invention comprises an edge illuminated photodiode that incorporates an n+ diffused region, which facilitates the minimization of edge surface recombination. Referring now to FIG. 1a, photodiode 101a is shown. Photodiode 101a comprises photochip 100a, which is made of a suitable semiconductor material possessing apt geometrical specifications. For example, and by no way of limitation, photochip 100a comprises silicon that is cuboidal in geometry.

The cuboid (or rectangular parallelepiped) shaped photochip 100a has six distinct facets. For purposes of elucidation, the sides or facets of photochip 100a have been enumerated as proximate 102a, distant 103a, top 104a, bottom 105a, left 106a, and right 107a. Persons of ordinary skill would appreciate that the present designation of photochip geometry is not limited to the description provided herein and can be adjusted to suit other design, fabrication, and functional specifications.

A substantial portion of proximate facet 102a comprises region 108a possessing characteristics designed to improve responsivity and quantum efficiency. Region 108a may be heavily doped, utilizing diffusion or implant techniques, with a suitable dopant of a particular conductivity type, such as p-type or n-type. In one preferred embodiment, an n-type dopant is used. Varieties of n-type dopants are known in this regard for instance, phosphorus (P), arsenic (As), antimony (Sb), among others. In one embodiment, the n+ doping layer is about 0.5 um to 1 um deep and can improve quantum efficiency by about 50% to about 80% depending on the wavelength, i.e. improving by 80% at 550 nm and by 50% at 850 nm.

A substantial portion of proximate facet 102a may be subjected to controlled n+ diffusion to generate an n+ diffused region 108a. There are many different approaches available in the prior art to carry out diffusion process, such as ion-implantation etc. However, the choice of the diffusion method is dependent on various factors, such as diffusion coefficient of the dopant, permissible error in diffusion depth, diffusion source, among other variables. It must be noted that the task stated above, such as diffusion, is routine undertaking of engineering for those of ordinary skill in the art having the benefit of this disclosure and, therefore, will not be further detailed herein.

The n+ diffused region 108a assists in minimizing a reduction in responsivity of photodiode chip 101a. Typically, a reduction in responsivity occurs due to edge surface recombination. The existence of n+ diffused region 108a helps generate an electric field that facilitates the repulsion of minority carriers, thereby minimizing recombination. It is therefore preferred that, in the formation of n+ diffused region 108a, dopant concentration should significantly exceed photogenerated carrier concentration. It must be noted that a heavily doped region juxtaposed to a relatively lightly doped region forms a high low n+ n junction, which acts as a low recombination velocity surface thereby facilitating minimization or reduction of surface recombination. Likewise, n+ diffused region 108a juxtaposed to a relatively lightly doped bulk region, specifically portion of photochip 100a flanking n+ diffused region 108a, forms an interface that acts as a low recombination velocity surface, thereby minimizing surface recombination.

Top facet 104a comprises two regions, 113a and 111a. Region 113a is essentially a heavily doped region. Region 113a may be doped with an appropriate impurity or dopant of selected conductivity type, such p-type or n-type. For instance, and by no way of limitation, a p-type dopant, such as boron, is preferred.

Region 111a comprises an anode metallization region. Appropriate metal is utilized in the formation of anode metallization region. For instance, use of gold (Au) or aluminum (Al) is preferred. Metallization can be accomplished using any of a number of known approaches, including, for instance, subtractive processes, fully additive processes, and semi-additive processes. Metallization is performed using an assortment of techniques including, but not restricted to, evaporation, sputtering, plating, or electrolytic or electroless. More specifically, semiconductor devices employ metallization primarily to serve at least dual purpose: a) to form an electrical contact and b) to form an interconnection means within die circuits. Known processes make use of appropriate metals and/or alloys as materials for metallization. For instance, thin-film aluminum is most extensively exploited material for metallization and, due to low resistivity and adhesion compatibility with silicon dioxide, is very suitable for metallization. A disadvantage of aluminum as metallization material is low melting temperature, i.e. 660° C., and low Al—Si eutectic temperature, i.e. 577° C. These restrict the maximum processing temperature once the aluminum layer has been deposited.

In one embodiment, bottom facet 105a is subjected to metallization. Accordingly, bottom facet 105a includes a cathode metallization layer 109a, which preferably comprises, but is not limited to, gold (Au).

In a second embodiment, the present invention comprises an edge illuminated photodiode incorporated in a suitable semiconductor substrate with an angled facet and a textured p+ surface. The textured p+ surface reduces reflectance thereby enhancing the quantum efficiency of the photodiode.

Figure 2A:
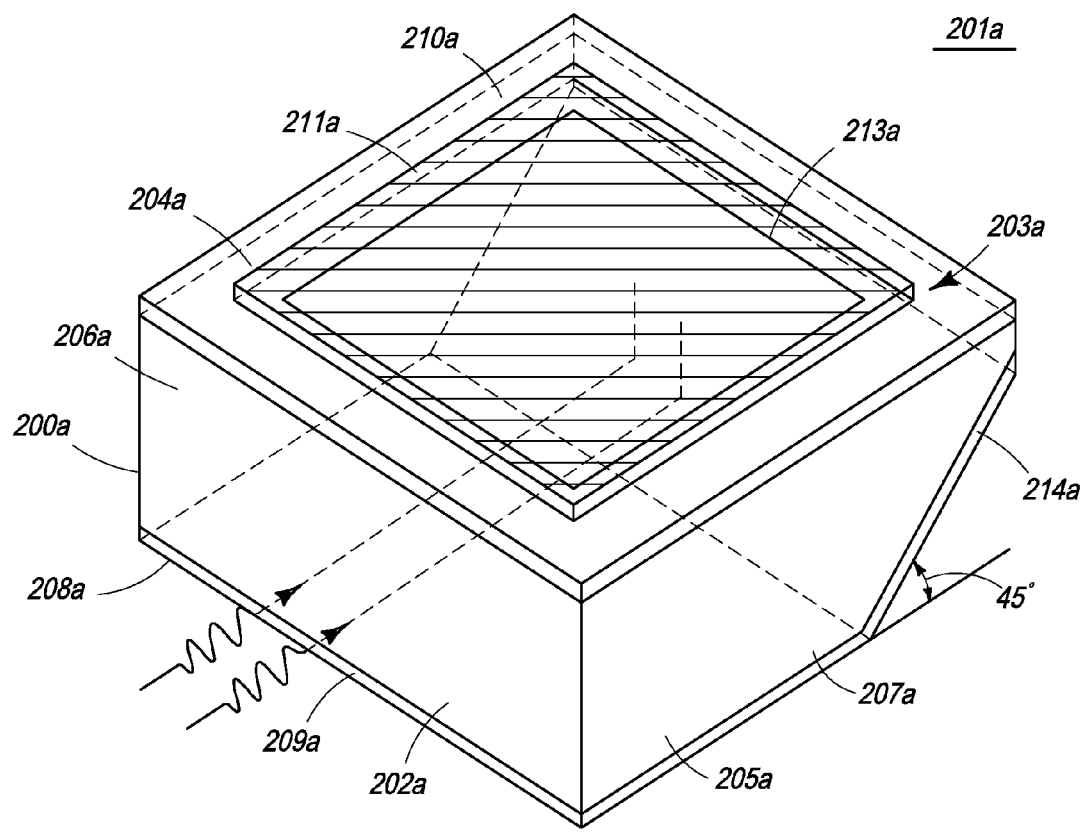
FIG. 2a is a perspective view of another embodiment of the edge illuminated photodiode of the present invention.

Referring now to FIG. 2a, an embodiment of an edge illuminated photodiode of the present invention is shown. Photodiode 201a comprises photochip 200a, which is made of a suitable semiconductor material possessing apt geometrical specifications. For example, and by no way of limitation, photochip 200a comprises silicon that is cuboidal in geometry. The cuboid (or rectangular parallelepiped) shaped photochip 200a has six distinct facets. For purposes of elucidation, the sides or facets of photochip 200a have been enumerated as proximate 202a, distant 203a, top 204a, bottom 205a, left 206a, and right 207a. Persons of ordinary skill would appreciate that the present designation of photochip geometry is not limited to the description provided herein and can be adjusted to suit other design, fabrication, and functional specifications.

Bottom surface 205a is subjected to metallization in accord with the principles of the present invention. Consequently, bottom facet 205a comprises a cathode metallization layer 208a. For example, and by no way of limitation, the use of gold (Au) is preferred.

Top facet 204a comprises two regions, 211a and 213a. Region 213a is essentially a heavily doped region. Region 213a may be doped with an appropriate impurity or dopant of selected conductivity type, such p-type or n-type. For instance, and by no way of limitation, a p-type dopant, such as Zn in InP/InGaAs photodiodes and boron in silicon photodiodes, is preferred. Region 211a comprises an anode metallization region. Appropriate metal is utilized in the formation of anode metallization region. For instance, use of gold (Au) or aluminum (Al) is preferred.

In one embodiment, the amount of light absorbed by the semiconductor substrate is improved by modifying the photodiode surface. Two mechanisms are primarily accountable for the minimization or reduction of the amount of light absorbed by a photodiode. First, light may be reflected off the semiconductor substrate, i.e. reflection losses. Second, light may enter the substrate and exit without having been absorbed, i.e. absorption losses. Both of these loss mechanisms can be controlled by the modifying the photodiode surface in an attempt to attain surface imperfections. Surface imperfections can be achieved via roughening or texturing of the substrate surface.

Surface texture plays a vital role in facilitating confinement or trapping of light within the photochip. Texture includes roughness, waviness, and lay, namely short wavelength deviations of a surface from the nominal surface. Surface texturization, or surface texturing, is responsible for altering the transmission properties of semiconductor surfaces within devices. Surface texturing facilitates 1) confinement or trapping of light, and 2) reduces reflectance thereby improving the quantum efficiency of devices. For instance, reflection losses are diminished via increment in the probability that a light ray will strike the substrate surface multiple times, whereas absorption losses are reduced via light confinement within the substrate body, called light trapping. Surface texturization of material is known to persons of ordinary skill in the art. In general, surface texturization is executed either via isotropic (dissolution) or anisotropic etching.

Figure 2B:
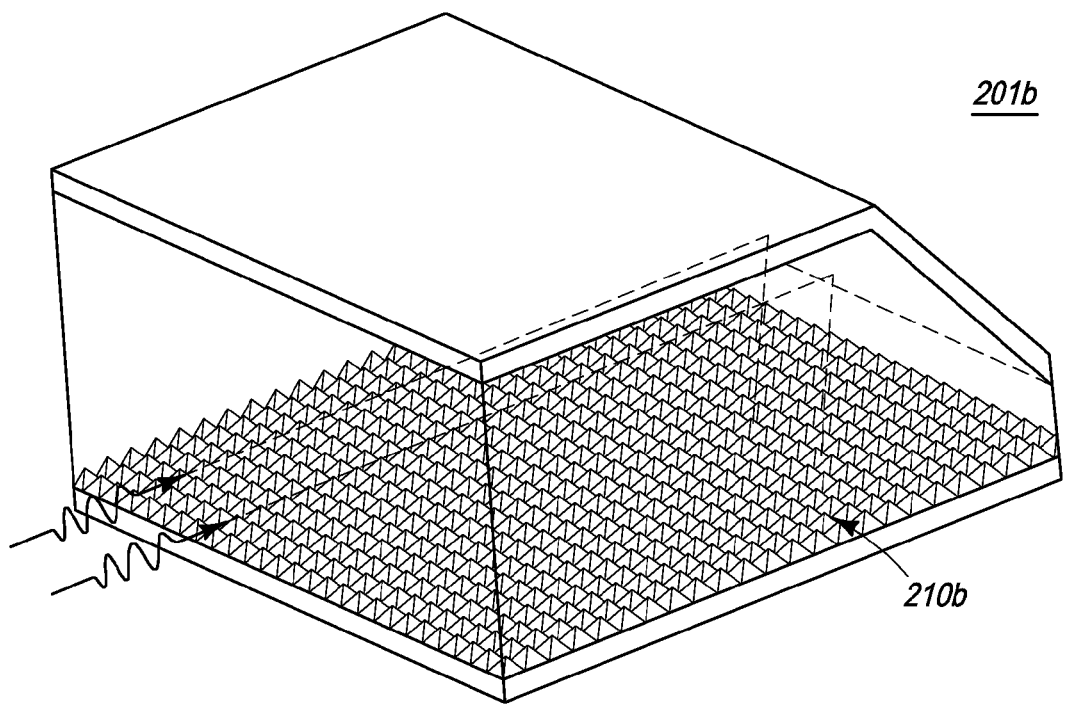

Surface textured region 210a is shown in FIG. 2a and is further detailed in FIG. 2b. FIG. 2b depicts a flipped perspective view of the edge illuminated InGaAs/InP photodiode 201a of FIG. 2a. In one embodiment, region 210b may be textured utilizing apt surface texturing techniques, irrespective of the crystallographic orientation of InGaAs/InP crystal, in an attempt to cause surface modifications thereupon through the formation of a plurality of convexities and concavities. These convexities and concavities possess apposite geometrical and dimensional specifications. For example, region 210b may be textured preferably forming a plurality of three-dimensional (3-D) square base pyramidal prisms therein. It must be noted here that the square base pyramidal prisms facilitate light trapping or confinement within photodiode 201b. In this regard, several texturing techniques are known that do not rely on crystallographic orientation, including reactive ion etching.

Referring back to FIG. 2a, a seventh facet 214a is positioned between two facets, preferably 203a and 205a. The seventh facet 214a is angled relative to distant facet 203a and bottom facet 205a. The angle of formation between the inner face of the seventh facet 214a and the inner face of distant facet 203a is between 90 and 180 degrees, preferably around 135 degrees. The angle of formation between the inner face of the seventh facet 214a and the inner face of bottom facet 205a is between 90 and 180 degrees, preferably around 135 degrees.

Angled facet 214a may be fabricated utilizing appropriate etching techniques. Typically, angled facets may be fabricated in an assortment of ways including, but not restricted to, wet etching and dry etching. A person of ordinary skill in the art would know how to fabricate angled facet 214a.

In one embodiment, photodiode 201a possesses the following specifications: device type is InP/InGaAs PIN photodiode; detection range varies from a minimum of approximately 800 nm to a maximum of approximately 1700 nm (i.e. optical bandwidth); active area diameter is typically 85 μm; operating voltage is typically −5 V; responsivity is at a minimum of approximately 0.70 A/W; dark current is <1 nA; reverse breakdown voltage is a minimum of 20 V; bandwidth is approximately 1 GHz; capacitance is 1 pF (when measured @ Vr=−5 V); operating temperature varies from a minimum of −40° C. to a maximum of 85° C.; chip size is 350*350 μm typical; chip thickness is 200 μm typical; and detectable area 75*35 μm. All parameters, discussed above, are applicable for a chip temperature range of −40° C. to +85° C. and include any detrimental effects due to end of life (EOL) characteristics. The above specifications are merely for the purposes of elucidation, and are not limiting. Various modifications to the disclosed embodiments will be readily apparent to those of ordinary skill in the art, and the disclosure set forth herein may be applicable to other embodiments and applications without departing from the spirit and scope of the present invention and the claims hereto appended.

Figure 2C:
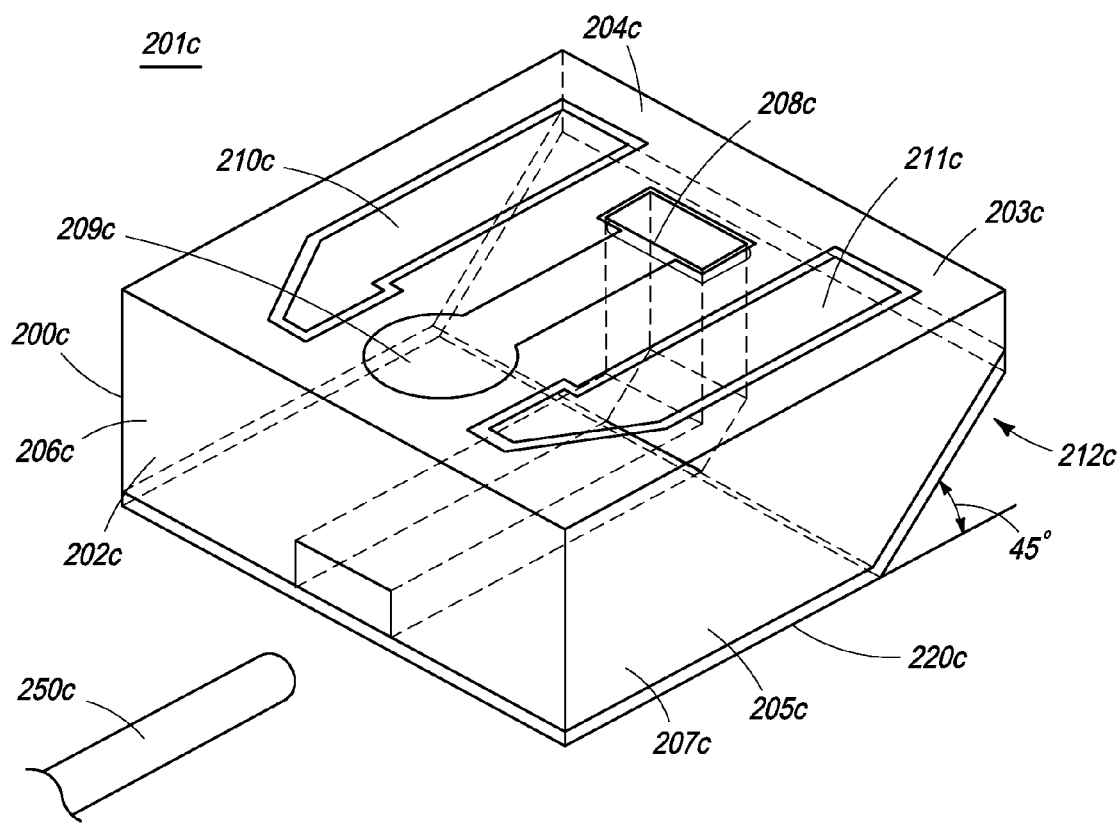
FIG. 2c, is a perspective view of another embodiment of an edge illuminated photodiode of the present invention.

A third embodiment of an edge illuminated photodiode of the present invention is depicted in FIG. 2c. Photodiode 201c comprises photochip 200c, which is made of a suitable semiconductor material possessing apt geometrical specifications. For example, and by no way of limitation, photochip 200c comprises silicon that is cuboidal in geometry. The cuboid (or rectangular parallelepiped) shaped photochip 200c has six distinct facets. For purposes of elucidation, the sides or facets of photochip 200c have been enumerated as proximate 202c, distant 203c, top 204c, bottom 205c, left 206c, and right 207c. Persons of ordinary skill would appreciate that the present designation of photochip geometry is not limited to the description provided herein and can be adjusted to suit other design, fabrication, and functional specifications.

Bottom surface 205a is subjected to metallization in accordance with the principles of the present invention. Consequently, bottom facet 205a comprises a finish layer 220c. For example, and by no way of limitation, the use of gold (Au) is preferred.

Top facet 204c comprises at least four regions, enumerated herein as first 208c, second 209c, third 210c, and fourth 211c. First region 208c is heavily doped, utilizing suitable diffusion techniques, with an apt impurity of the selected conductivity type, such as p-type or n-type. For instance, region 208c is p+ doped. Region 208c may be doped with a p-type dopant selected the group including Zn or Be for InP material and boron or gallium for silicon. In one embodiment, first region 208c possesses the following specifications: dimensions (length*breadth) of approximately 75 μm*35 μm and the breadth-wise distance of longer edge of first region 208c from the distant edge of top facet 204c is 70 μm.

In one embodiment, region 208c is textured using surface texturing techniques to cause surface modifications thereupon. These convexities and concavities possess apposite three-dimensional (3-D) geometrical specifications. For instance, this region 208c is textured to form a plurality of square base pyramidal prisms therein. It must be noted here that square base pyramidal prisms facilitate light trapping or confinement within the photochip 200c.

Second region 209c is preferably subjected to anode metal plating techniques. For example, and by no way of limitation, the use of gold (Au) as plating metal is preferred. Regions 210c and 211c are heavily doped with an impurity of a selected conductivity type, such as p-type or n-type. For example, regions 210c and 211c are preferably n+ doped. In one embodiment, a peripheral portion of regions 210c and 211c is delimited by a length of cathode metal plating. For example, and by no way of limitation, the use of gold (Au) as cathode plating metal is preferred.

Referring back to FIG. 2c, a seventh facet 212c is positioned between two facets, preferably 203c and 205c. The seventh facet 212c is angled relative to distant facet 203c and bottom facet 205c. The angle of formation between the inner face of the seventh facet 212c and the inner face of distant facet 203c is between 90 and 180 degrees, preferably around 135 degrees. The angle of formation between the inner face of the seventh facet 212c and the inner face of bottom facet 205c is between 90 and 180 degrees, preferably around 135 degrees. Angled facet 212c may be fabricated utilizing appropriate etching techniques.

Operationally, whenever a single mode fiber 250c emanating light at wavelengths varying from a minimum of approximately 1300 nm to a maximum of approximately 1550 nm is positioned in vicinity of proximate facet 202c, comprising a detectable area (i.e. 75 μm*35 μm), light penetrates through the photodiode chip 201c, gets reflected by angled edge 214c, bends by 90°, and is incident on the textured p+ region 208c. P+ region is textured in an attempt to decrease reflectance at this surface thereby improving quantum efficiency of photodiode 201c.

In current embodiment, the photodiode 201c may preferably possess the following preliminary specifications: device type is InP/InGaAs PIN photodiode; detection range varies from a minimum of approximately 800 nm to a maximum of approximately 1700 nm (i.e. optical bandwidth); active area diameter of about 85 μm; operating voltage of about −5 V; responsivity at a minimum of approximately 0.70 A/W; dark current is <1 nA; reverse breakdown voltage is a minimum of 20 V; bandwidth is about 1 GHz; capacitance is about 1 pF (when measured @ Vr=−5 V); operating temperature varies from a minimum of −40° C. to a maximum of 85° C.; chip size is 350*350 μm typical; chip thickness is 200 μm typical; and detectable area 75*35 μm. All parameters, discussed above, are applicable for a chip temperature range of −40° C. to +85° C. and include any detrimental effects due to end of life (EOL) characteristics.

Figure 2D:
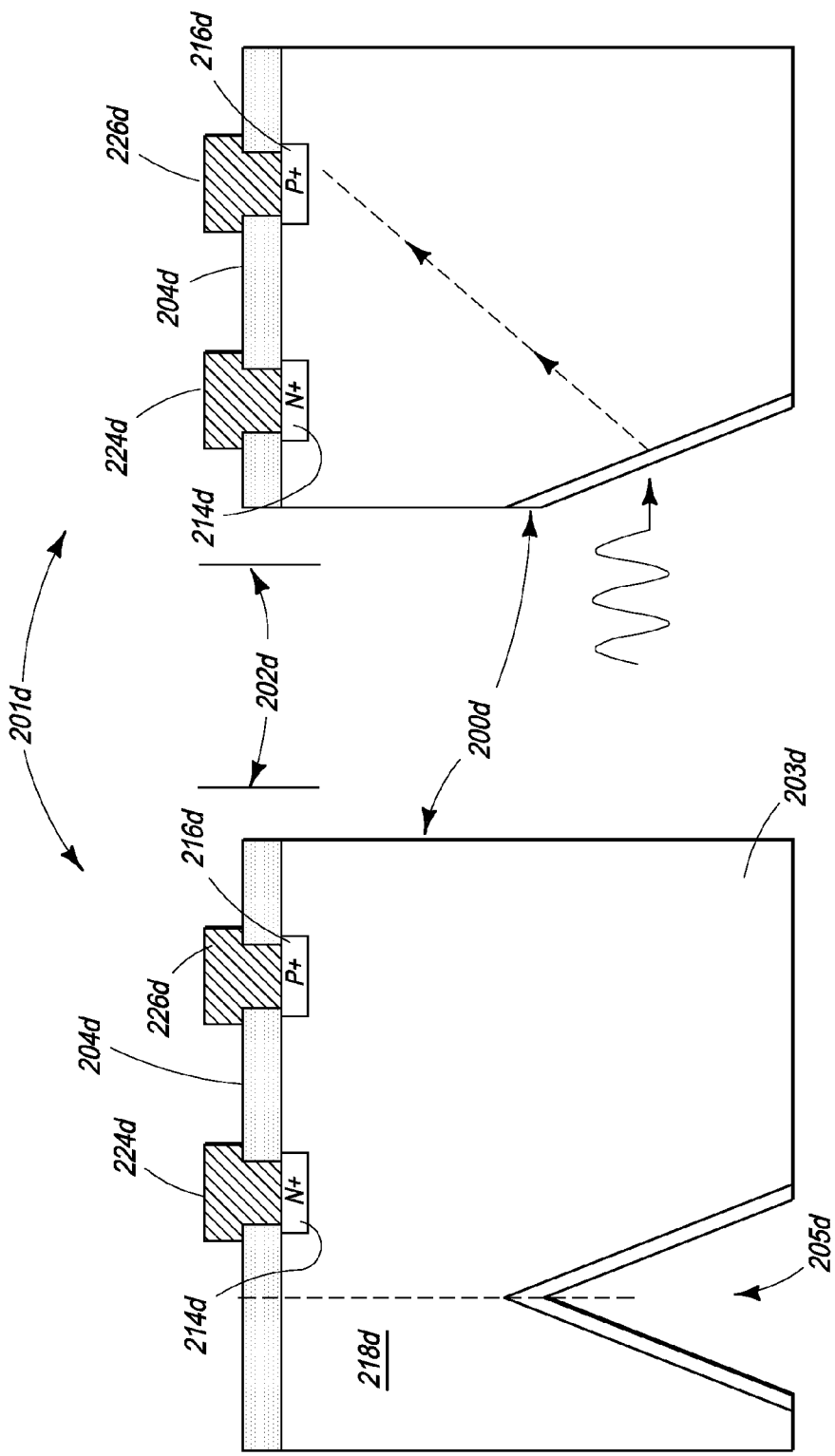
FIG. 2d depicts two distinct stages, prior to and subsequent to photochip dicing, using two schematic diagrams.

Another embodiment of the edge illuminated photodiode of the present invention is depicted in FIG. 2d which illustrates two distinct stages: prior to, and subsequent to, photochip dicing. Photochip 200d, prior to dicing, comprises a photodiode 201d having two primary regions, 202d and 203d. First region 202d comprises alternating heavily doped regions, such as 214d and 216d, doped with impurities of selected conductivity types. For example, but not limited to such example, first heavily doped region 214d is doped with a suitable impurity of a first selected conductivity, i.e. n-type, whereas second heavily doped region 216d is doped with a suitable impurity of a second selected conductivity type, in opposition to first, i.e. p-type. These alternating heavily doped regions are positioned proximate to the front side of device photochip 200d.

In one embodiment, second region 204d is in essence a passivation layer selectively grown atop front side of photochip 200d. For example, use of materials including, but not limited to, silicon nitride, silicon oxide, silicon oxynitride or a layered combination of the aforementioned materials, etc. is preferred for the formation of the passivation layer. Regions 224d and 226d, which are devoid of the passivation layer and positioned immediately atop heavily doped regions, 214d and 216d respectively, are preferably subjected to selective metallization.

The photodiode chip after photochip dicing is manufactured by eliminating region 218d, shown in the photodiode chip before photochip dicing. To eliminate region 218d, an initial v-groove 205d is manufactured in the photochip 200d. Typically, the photochip 200d is first coated with a layer of first masking material on its back side. Preferably, the first masking layer may be fabricated from materials, such as those of silicon dioxide (i.e. SiO.sub.2), or silicon nitride (i.e. Si.sub.3 N.sub.4). Although use only of certain masking materials, such as those of silicon dioxide or silicon nitride, has been recommended persons of ordinary skill would appreciate that the utilization of materials for the fabrication of the first masking layer is not limited to the aforesaid materials and can be changed to suit other requirements.

Once the first masking layer is applied to the back side of the photochip, it is then superimposed with another conventional photoresist mask, thereby forming a second masking layer over the photochip. Using any of conventional photolithographic techniques including, but not restricted to, optical, UV (i.e. ultraviolet), EUV (i.e. enhanced ultraviolet) photolithography, e-beam or ion-beam lithography, x-ray lithography, interference lithography, etc. a pattern is rendered on the photoresist mask or layer. The photoresist is exposed and developed, thereby exposing the photochip through the pattern. For instance, and by no way of limitation, use is made of a buffered hydrofluoric acid (i.e.H.F.sub.3) to etch the first masking layer preferably made of SiO.sub.2. As an alternative, dry plasma gas etching can be used.

After the photoresist is locally removed and the first masking layers are etched, the photoresist is stripped off from the photochip and the photochip subjected to anisotropic etching with, for example, a mixture of $HBR:H_2O_2:H_2O=1:1:3$ can be used to create the V-groove in the InP layer. Typically, the finished width of V-grooves can be controlled to within 0.5 to 1 μm, such control being achieved using silicon nitride masks and EDP as the etchant.

The first masking layer is then stripped off the photochip. Portions of the photochip through the pattern in the first masking layer are typically, anisotropically etched to create the desired features (i.e., the v-groove) that lie in the back side of photochip vicinal crystal plane. For example, and not intended to be limiting, use is made of anisotropic etching technique to form the three dimensional v-groove on the back side of the photochip 200d at suitable position, such as 205d, as shown in FIG. 2d. It must be noted here that inner wall of V-groove 205d is coated with an appropriate anti-reflective (AR) layer. For example, use of silicon nitride as AR layer is preferred. After dicing the photochip into dies, the region 218d is automatically removed.

Figure 3A:
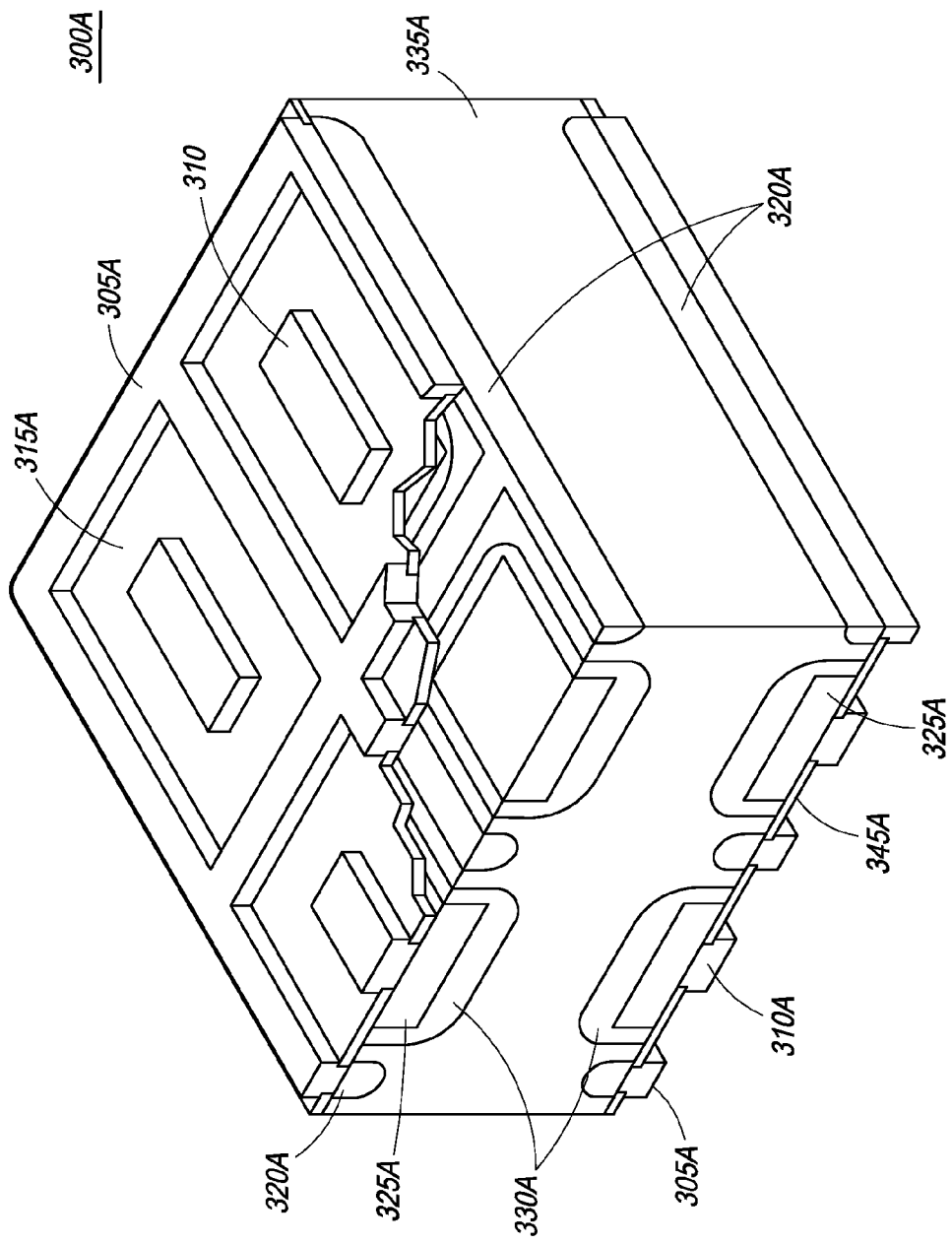
FIG. 3a is a perspective view of another embodiment of the present invention, comprising PN-junctions on both the front and back surfaces.

Referring to FIG. 3A, in another embodiment, the present invention is directed toward a photodiode 300a having a top surface 315a and a bottom surface 345a separated by p-type silicon 335a. Located proximate to the top surface 315a and bottom surface 345a are p+ regions 320a and n+ regions 325a. An anode metal layer 305a is plated atop the p+ 320a regions and a cathode metal layer 310a is plated atop the n+ regions 325a. During operation, as also shown in FIG. 3C, depletion regions 330a, 330c form around the n+ regions 325a, 325c proximate to both the top 315a and bottom surfaces 345a, and between p+ region 320a, 320c. It is advantageous to have PN-junctions on both the top and bottom surfaces for silicon side illuminated photodiodes operated in relatively low reverse bias mode. While a p-type silicon region 335a is depicted having n+ depletion regions, it should be appreciated that the region types can be reversed, thereby having a n+ type silicon region 335a with p+ depletion regions.

Figure 3B:
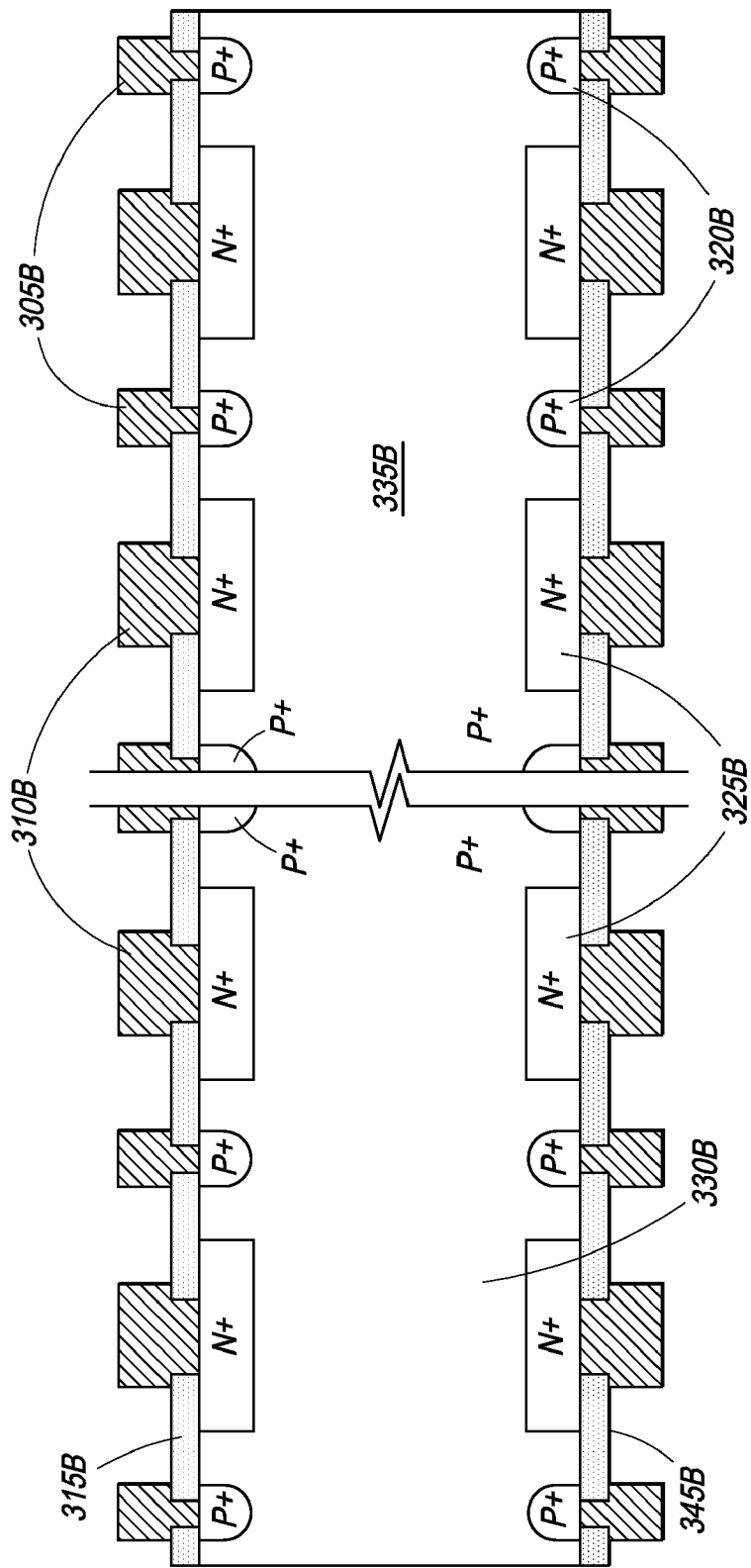
FIG. 3b is a schematic view of another embodiment of the present invention, comprising PN-junctions on both the front and back surfaces.

Referring to FIG. 3B, in another schematic view of the embodiment in FIG. 3A, a photodiode 300b having a top surface 315b and a bottom surface 345b separated by p-type silicon 335b is shown. Located proximate to the top 315b and bottom 345b surfaces are p+ 320b and n+ 325b regions. An anode metal layer 305b is plated atop the p+ 320b regions and a cathode metal layer 310b is plated atop the n+ regions 325b. During operation, depletion regions 330b form around the n+ regions 325b proximate to both the top 315b and bottom 345b surfaces. When a reverse bias is applied to both the top and bottom NP-junctions, the depletion regions extend quickly into the vertical direction and eventually merge together at a certain bias. The photogenerated carriers are collected immediately by the electric field of the extended depletion regions. Thus, the quantum efficiency, the speed of response, and the crosstalk are improved significantly.

In one embodiment, the distance between the centers of adjacent n+ regions 325*b* is approximately 170 μm, and the distance between the centers of adjacent cathode metal layers 310*b* is approximately 170 μm. In another embodiment, the distance between the edges of adjacent n+ regions 325*b* is approximately 50 μm. In yet another embodiment, the width of an n+ region 325*b* is approximately 120 μm.

In another embodiment, the present invention comprises an edge illuminated photodiode incorporated in a suitable semiconductor substrate with an interior placed V-groove. The interior placed V-groove reduces reflectance thereby enhancing the quantum efficiency of the photodiode.

Referring now to FIG. 4*a*, photodiode 401*a* is shown. Photodiode 401*a* comprises photochip 400*a*, which is made of a suitable semiconductor material possessing apt geometrical specifications. For example, and by no way of limitation, photochip 400*a* comprises silicon that is cuboidal in geometry. In one embodiment the photochip 400A comprises n-type silicon.

Photodiode 401A comprises a top region 415A having an oxide layer 425A and a V-groove 418A penetrating the width of the top region 415A. Photodiode 401A further comprises a bottom region 445A having a n+ metallization layer 435A. Impinging within, and through, the oxide layer 425A is at least one p+ metallization region 455A.

Immediately below the oxide layer 425A in the top region 415A are two regions. The first region is a p+ diffused layer 408*a* that extends for a portion of the length of the oxide layer 425A. The p+ layer 408A assists in minimizing a reduction in responsivity of photodiode chip 401A to incoming radiation 475A. The p+ layer does not extend the length of oxide layer 425A but does however, extend below the V-groove 418A in conjunction with the oxide layer 425A. The p+ layer is in physical communication with the p+ metallization region 455A. The second region is n-type silicon 409A.

Referring to FIG. 4B, the same photodiode of FIG. 4A is shown with the addition of a layer of film 428B, such as clear polymide film or undoped silica film. Photodiode 401B comprises a top region 415B having an oxide layer 425B and a V-groove 418B penetrating the width of the top region 415B. The addition of the layer of film 428B creates a substantially planar region above the V-groove and serves to make the photodiode 401B more rugged. Photodiode 401B further comprises a bottom region 445B having a n+ metallization layer 435B on top of a n+ diffused layer. Impinging within, and through, the oxide layer 425B is at least one p+ metallization region 455B.

Immediately below the oxide layer 425B in the top region 415B are two regions. The first region is a p+ diffused layer 408B that extends for a portion of the length of the oxide layer 425B. The p+ layer 408B assists in minimizing a reduction in responsivity of photodiode chip 401B to incoming radiation 475B. The p+ layer does not extend the length of oxide layer 425B but does however, extend below the V-groove 418B in conjunction with the oxide layer 425B. The p+ layer is in physical communication with the p+ metallization region 455B. The second region is n-type silicon 409B.

Figure 5:
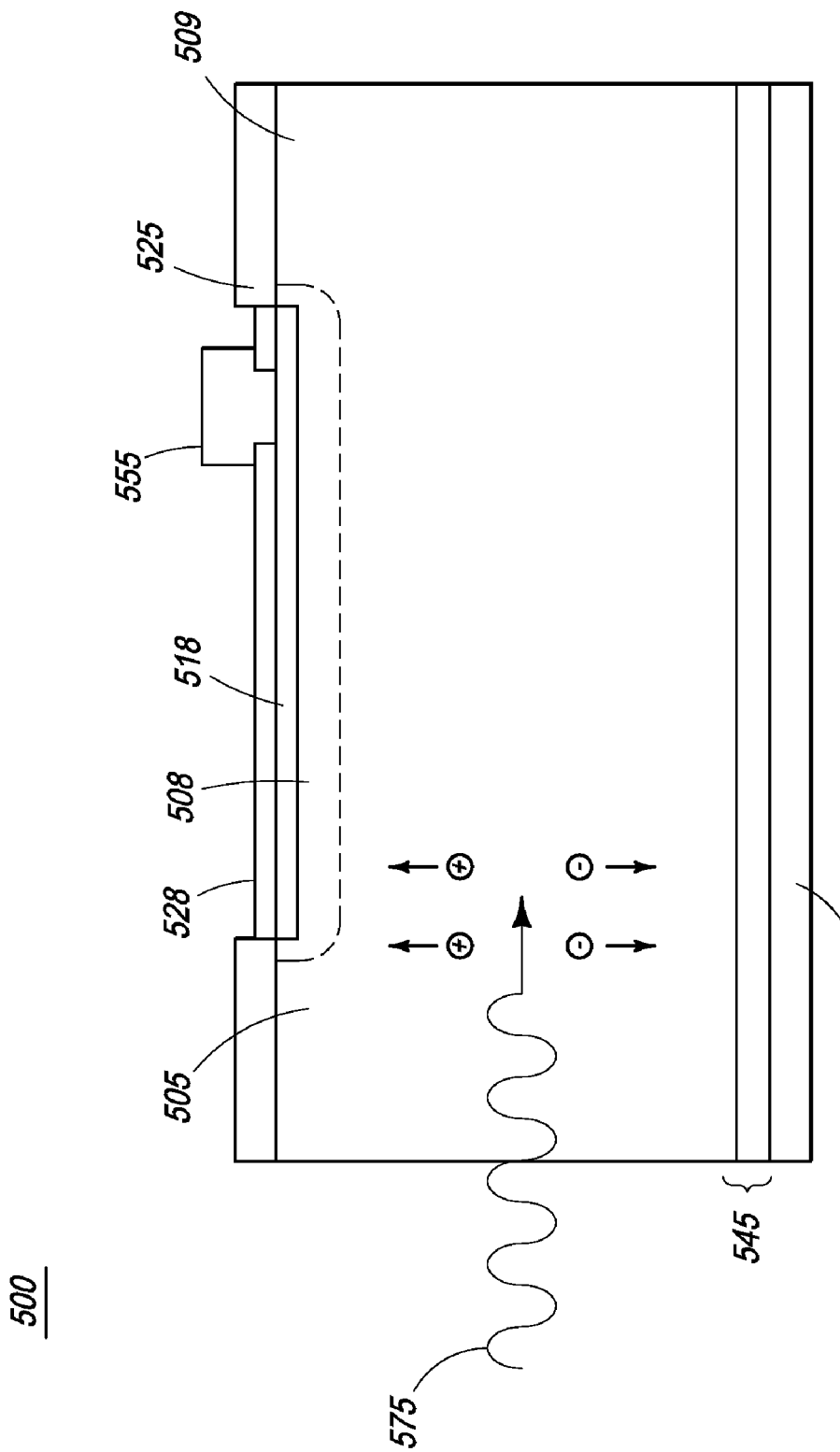
FIG. 5 is a schematic view of another embodiment of the present invention.

It should be appreciated that, since the p+ layer is created underneath the V-groove, the depletion region of the PN-junction exists deep below the front surface of the photodiode chip; therefore, photo-generated carriers from a side illumination will collect before they have a chance to recombine. Conversely, in a conventional photodiode 500 having a n+ bottom layer 545, n+ metal layer 535, a p+ layer 518, an anti-reflective layer 528, a depletion region 508, a p+ metal contact 555, an oxide layer 525, on n-type silicon 509, as shown in FIG. 5, photo-generated carriers 505, generated from a side illumination 575, have to travel a much longer distance to the depletion region and, therefore, are susceptible to carrier recombination loss.

It should be appreciated that the V-groove device of the present invention can be made more economically and efficiently than the embodiment depicted in FIG. 1 because the manufacturing process employs a wet KOH etch which is faster than the RIE etches required to manufacture the embodiment of FIG. 1. It should also be appreciated that the selected conductivity type of the aforementioned regions could be reversed, i.e. the n-type silicon photochip could be p-type, the n+ metallization layer could be p+, the p+ metallization region could be n+, and the p+ diffused layer in the top region could be n+, and still fall within the scope of the present invention. It should also be appreciated that the exemplary dimensions and doping characteristics are not limiting.

The photodiodes of the present invention can be employed in an assortment of applications including, but not limited to, spectroscopy, distance and speed measurement, laser ranging, laser guided missiles, laser alignment and control systems, optical free air communication, optical radar, radiation detection, optical position encoding, film processing, flame monitoring, scintillator read out, environmental applications such as spectral monitoring of earth ozone layer and pollution monitoring, low light-level imaging, such as night photography, nuclear medical imaging, photon medical imaging, and multi-slice computer tomography (CT) imaging, security screening and threat detection, thin photochip applications, and a wide range of computing applications.

The above discussion is aimed towards providing a preferred embodiment incorporating the novel aspects of the present invention and it should be understood that the foregoing illustration is not the only application where the present invention can be reduced down to practice. The present invention can be suitably modified to incorporate other possible embodiments as well. The scope of the invention is defined solely by the accompanying claims and within the scope of the claims; the present invention can be employed in various other situations. For example, circumstances wherein design and fabrication of edge illuminated photodiodes possessing an assortment of figures of merit, quantitative or numerical measure of performance characteristics, for instance, and by no way of limitation, low cost, economically, technically, and operationally feasible, high responsivity, high quantum efficiency using n+ diffused layer, p+ textured surface, and reliance on diverse photochips, such as InGaAs/InP, silicon, etc. is desired while still staying within the scope of the present invention.

We claim:

1. An edge illuminated photodiode comprising:
   a substrate with at least a top side, a bottom side, a proximate edge side, a distal edge side, a right side, and a left side, wherein said top side comprises
      a first region having a textured surface adapted to receive light reflected within said photodiode and trap light within said photodiode;
      a second region, wherein said second region has been subjected to anode metal plating;
      a third region having an impurity of a first selected conductivity type; and
      a fourth region having an impurity of a second selected conductivity type, wherein the third region does not physically overlap with the fourth region.

2. The edge illuminated photodiode of claim 1 wherein the first region is heavily doped.

3. The edge illuminated photodiode of claim 1 wherein the first region is p+ doped using a p type dopant, wherein said p type dopant is at least one of Zn, Be, boron, or gallium.

4. The edge illuminated photodiode of claim 1 wherein the first region has a length of approximately 75 μm and a width of approximately 35 μm.

5. The edge illuminated photodiode of claim 1 wherein the first region comprises a plurality of square base pyramidal prisms.

6. The edge illuminated photodiode of claim 1 wherein the first and selected conductivity types are both n-type.

7. The edge illuminated photodiode of claim 1 wherein a portion of a periphery of at least one of the third region or fourth region is delimited by a length of cathode metal plating.

8. The edge illuminated photodiode of claim 1 wherein the bottom side comprises a cathode metallization layer.

9. The edge illuminated photodiode of claim 1 wherein the proximate edge side comprises a region doped with an impurity of a first conductivity type.

10. The edge illuminated photodiode of claim 1 wherein the first conductivity type is n-type.

11. The edge illuminated photodiode of claim 10 wherein the n-type conductivity is achieved using a n-type dopant and wherein the n-type dopant is at least one of phosphorus, arsenic, or antimony.

12. The edge illuminated photodiode of claim 11 wherein the n-type dopant creates a n+ doping layer and wherein said n+ doping layer is approximately 0.5 μm to 1 μm deep.

13. The edge illuminated photodiode of claim 1 wherein the distal edge side comprises a side angled relative to said bottom side.

14. The edge illuminated photodiode of claim 10 wherein an inner face of said distal edge side forms an angle with an inner face of said bottom side, and wherein said angle is greater than 90 degrees.

15. The edge illuminated photodiode of claim 1 wherein said edge illuminated photodiode has a detection range and wherein said detection range is from 800 nm to 1700 nm.

16. An edge illuminated photodiode comprising:
a substrate with at least a top side, a bottom side, a proximate edge side, a distal edge side, a right side, and a left side, wherein said top side comprises a first region having a textured surface adapted to receive light reflected within said photodiode and trap light within said photodiode and a second region, wherein said second region has been subjected to anode metal plating and wherein said distal side forms an angle with said bottom side greater than 90 degrees.

17. The edge illuminated photodiode of claim 16 wherein said edge illuminated photodiode has an operating voltage of approximately −5 V.

18. The edge illuminated photodiode of claim 16 wherein said edge illuminated photodiode has a minimum responsivity of approximately 0.70 A/W.

19. The edge illuminated photodiode of claim 16 wherein said edge illuminated photodiode has a dark current of less than 1 nA.

* * * * *